US012142572B2

(12) United States Patent
Seo (10) Patent No.: US 12,142,572 B2
(45) Date of Patent: Nov. 12, 2024

(54) SEMICONDUCTOR PACKAGE INCLUDING STACKED SEMICONDUCTOR CHIPS

(71) Applicant: SK hynix Inc., Icheon-si Gyeonggi-do (KR)

(72) Inventor: Hyun Chul Seo, Icheon-si (KR)

(73) Assignee: SK hynix Inc., Icheon-si (KR)

(*) Notice: Subject to any disclaimer, the term of this patent is extended or adjusted under 35 U.S.C. 154(b) by 278 days.

(21) Appl. No.: 17/580,368

(22) Filed: Jan. 20, 2022

(65) Prior Publication Data

US 2023/0068842 A1    Mar. 2, 2023

(30) Foreign Application Priority Data

Aug. 24, 2021  (KR) ......................... 10-2021-0111423

(51) Int. Cl.
*H01L 23/538* (2006.01)
*H01L 25/065* (2023.01)

(52) U.S. Cl.
CPC ...... *H01L 23/5386* (2013.01); *H01L 23/5384* (2013.01); *H01L 23/5385* (2013.01); *H01L 25/0657* (2013.01)

(58) Field of Classification Search
CPC ... H01L 2224/16146; H01L 2224/0603; H01L 2224/1703; H01L 2224/16145; H01L 2224/32145; H01L 2224/24145; H01L 2225/06513; H01L 2225/06517; H01L 2225/06541; H01L 24/10; H01L 24/25; H01L 24/18; H01L 23/5386; H01L 25/0657

See application file for complete search history.

(56) References Cited

U.S. PATENT DOCUMENTS

| 11,844,223 | B1* | 12/2023 | Mathuriya | .......... G11C 11/4097 |
| 2020/0152602 | A1* | 5/2020 | Wei | .......................... H01L 25/50 |
| 2020/0303341 | A1 | 9/2020 | Kim et al. | |
| 2021/0005667 | A1* | 1/2021 | Mazed | .................. H10K 85/221 |
| 2021/0175161 | A1* | 6/2021 | Park | ........................ H01L 23/13 |

(Continued)

FOREIGN PATENT DOCUMENTS

| KR | 100688500 | B1 | | 3/2007 |
| TW | 202119508 | A | * | 5/2021 |

*Primary Examiner* — Victor A Mandala
*Assistant Examiner* — Lawrence C Tynes, Jr.
(74) *Attorney, Agent, or Firm* — WILLIAM PARK & ASSOCIATES LTD.

(57) ABSTRACT

A semiconductor package includes: a substrate; a first semiconductor chip positioned over the substrate and electrically connected to the substrate; a second semiconductor chip stack positioned over the first semiconductor chip and including a plurality of second semiconductor chips that are stacked in a vertical direction while being electrically connected to the first semiconductor chip; and a dummy third semiconductor chip positioned over the second semiconductor chip stack, wherein a third height of a third bonding structure coupling the third semiconductor chip to an uppermost second semiconductor chip among the second semiconductor chips is greater than a second height of a second bonding structure coupling one among the second semiconductor chips to an another one among the second semiconductor chips positioned directly therebelow or the first semiconductor chip positioned directly therebelow.

20 Claims, 6 Drawing Sheets

(56) References Cited

U.S. PATENT DOCUMENTS

| | | | |
|---|---|---|---|
| 2021/0193623 A1* | 6/2021 | Oh | G11C 29/025 |
| 2021/0305188 A1* | 9/2021 | Shin | H01L 25/0652 |
| 2021/0375810 A1* | 12/2021 | Kim | H01L 23/5386 |
| 2022/0415777 A1* | 12/2022 | Chen | H01L 23/49833 |
| 2023/0059491 A1* | 2/2023 | Dokania | H01L 23/36 |

* cited by examiner

SEMICONDUCTOR PACKAGE INCLUDING STACKED SEMICONDUCTOR CHIPS

CROSS-REFERENCE TO RELATED APPLICATIONS

The present application claims priority of Korean Patent Application No. 10-2021-0111423, filed on Aug. 24, 2021, which is incorporated herein by reference in its entirety.

BACKGROUND

1. Technical Field

Examples of embodiments of the present disclosure relate to a semiconductor package, and more particularly, to a semiconductor package including two or more semiconductor chips that are stacked in a vertical direction.

2. Related Art

Electronic products are required to have a smaller volume while satisfying high performance/high capacity. Accordingly, semiconductor packages used for such electronic products are also required to include a plurality of semiconductor chips while having a predetermined size or smaller.

The multiple semiconductor chips may be stacked in a vertical direction and may be electrically connected using a through electrode, such as a Through Silicon Via (TSV). In order to realize a thin semiconductor package, each of the multiple semiconductor chips may be required to have a thin thickness.

SUMMARY

In accordance with an embodiment of the present disclosure, a semiconductor package may include: a substrate; a first semiconductor chip positioned over the substrate and electrically connected to the substrate; a second semiconductor chip stack positioned over the first semiconductor chip and including a plurality of second semiconductor chips that are stacked in a vertical direction while being electrically connected to the first semiconductor chip; and a dummy third semiconductor chip positioned over the second semiconductor chip stack, wherein a third height of a third bonding structure coupling the third semiconductor chip to an uppermost second semiconductor chip among the second semiconductor chips is greater than a second height of a second bonding structure coupling one among the second semiconductor chips to an another one among the second semiconductor chips positioned directly therebelow or the first semiconductor chip positioned directly therebelow.

In accordance with another embodiment of the present disclosure, a semiconductor package may include: a substrate; a first semiconductor chip positioned over the substrate and electrically connected to the substrate by a first bonding structure; a second semiconductor chip stack positioned over the first semiconductor chip and including a plurality of second semiconductor chips that are stacked in a vertical direction, where each of the second semiconductor chips is electrically connected to one of the second semiconductor chips directly therebelow or the first semiconductor chip directly therebelow by a second bonding structure; and a third semiconductor chip positioned over an uppermost second semiconductor chip among the second semiconductor chips, and not electrically connected but physically connected to the uppermost second semiconductor chip by a third bonding structure, wherein the third semiconductor chip has substantially the same structure as a structure of the first semiconductor chip or a structure in which a first rear coupling electrode is omitted from the first semiconductor chip.

DETAILED DESCRIPTION

Examples of embodiments of the present disclosure will be described below in more detail with reference to the accompanying drawings. The present disclosure may, however, be embodied in different forms and should not be construed as limited to the embodiments set forth herein. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. When a first layer is referred to as being "below" a second layer or "below" a substrate, it not only refers to a case where the first layer is formed directly therebelow the second layer or the substrate but also a case where a third layer exists between the first layer and the second layer or the substrate. It will be understood that, although the terms first, second, third etc. may be used herein to describe various elements, components, regions, layers, chips, stacks, and/or sections, these elements, components, regions, layers, chips, stacks, and/or sections should not be limited by these terms. These terms are only used to distinguish one element, component, region, layer, chip, stack, or section from another region, layer, chip, stack, or section. Thus, a first element, component, region, layer, chip, stack, or section discussed below could be termed a second element, component, region, layer, chip, stack, or section without departing from the teachings of the present disclosure.

Embodiments of the present disclosure may be directed to a semiconductor package which includes a plurality of semiconductor chips stacked in a vertical direction and may be capable of improving a fabrication process while relieving stress applied thereto.

Figure 1:
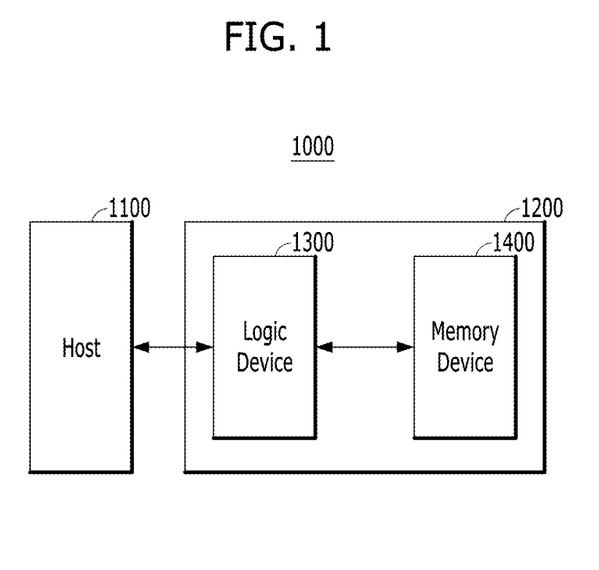
FIG. 1 is a block diagram illustrating a memory system in accordance with an embodiment of the present disclosure.

FIG. 1 is a block diagram illustrating a memory system in accordance with an embodiment of the present disclosure.

Referring to FIG. 1, the data processing system 1000 may include a host 1100 and a memory system 1200.

The host 1100 may include various wired and wireless electronic devices, such as a mobile phone, an MP3 player, a laptop computer, a desktop computer, a game player, a TV, a projector, and the like. Also, the host 1100 may include at least one Operating System (OS). The operating system may manage and control the general functions and operations of the host 1100 and may be executed in response to a request from a user who uses the data processing system 1000 or the memory system 1200.

The memory system 1200 may execute various operations in response to a request from the host 1100. In particular, the memory system 1200 may store data accessed by the host 1100. In other words, the memory system 1200 may be used as a main memory device or an auxiliary memory device of the host 1100.

The memory system 1200 may include a memory device 1400 that stores data, and a logic device 1300 that controls the operation of the memory device 1400.

The memory device 1400 may store data accessed by the host 1100, and may include a volatile memory, such as a Dynamic Random Access Memory (DRAM) and a Static Random Access Memory (SRAM), and a non-volatile memory, such as a NAND Flash, a Resistive Random Access Memory (RRAM), a Phase-change Random Access Memory (PRAM), a Magneto-resistive Random Access Memory (MRAM) and a Ferroelectric Random Access Memory (FRAM), or a combination thereof.

The logic device 1300 may control the memory device 1400 in response to a request from the host 1100. As an example, the logic device 1300 may provide data read from the memory device 1400 to the host 1100 or store data provided from the host 1100 in the memory device 1400. The logic device 1300 may include a Central Processing Unit (CPU), a controller, an Application Specific Integrated Circuit (ASIC), an application processor (AP), and the like. Although not illustrated, the logic device 1300 may include diverse required units, such as an interface unit for interfacing with the host 1100 and the memory device 1400, a processor for controlling the overall operation of the memory system 1200, and a power management unit for receiving and managing a power source required for the logic device 1300.

When the logic device 1300 controls the memory device 1400, the logic device 1300 may be referred to as a master device and the memory device 1400 may be referred to as a slave device. According to the embodiment of the present disclosure, a case where the logic device 1300 controls one memory device 1400 is described, but the present disclosure is not limited thereto. The logic device 1300 may be coupled to two or more memory devices to control them.

In the data processing system 1000 described above, each of the memory device 1400 and the logic device 1300 may be realized as a semiconductor chip. Furthermore, the memory system 1200 including the memory device 1400 and the logic device 1300 may be realized as one package.

In other words, the memory system 1200 may be realized as a System-In-Package (SIP) in which a memory chip and a logic chip are integrated into one package. This will be described below with reference to FIG. 2 below.

Figure 2:
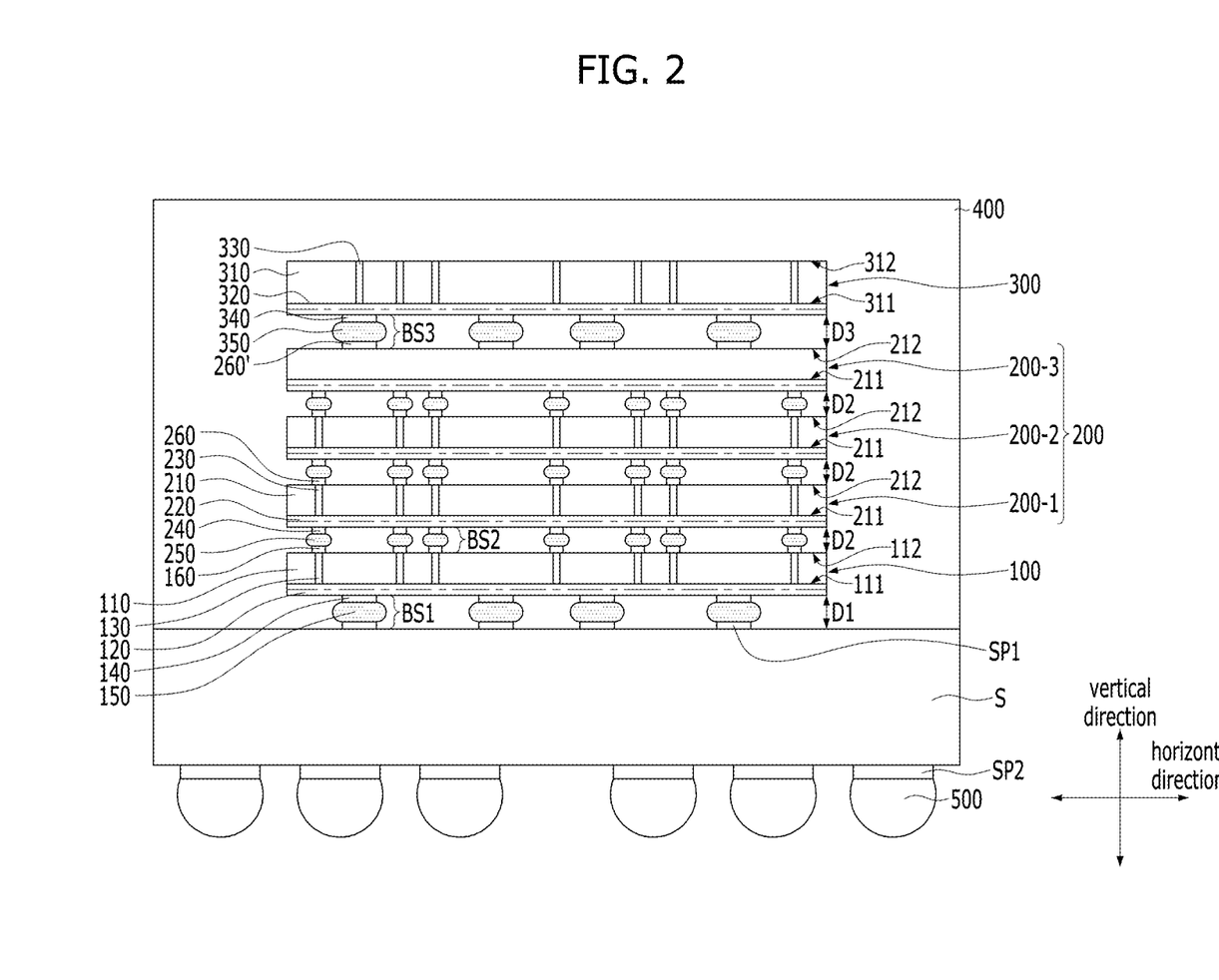
FIG. 2 is a cross-sectional view illustrating a semiconductor package in accordance with an embodiment of the present disclosure.

FIG. 2 is a cross-sectional view illustrating a semiconductor package in accordance with an embodiment of the present disclosure.

Referring to FIG. 2, the semiconductor package according to the embodiment of the present disclosure may include a substrate S, and a first semiconductor chip 100, a second semiconductor chip stack 200, a third semiconductor chip 300, a molding layer 400, and an external coupling electrode 500 that are vertically stacked over the substrate S.

The substrate S may include a circuit and/or a wiring structure for electrically connecting the first semiconductor chip 100 to an external element (not shown). For example, the substrate S may include a Printed Circuit Board (PCB), an interposer, a redistribution layer, and the like.

The substrate S may include an upper surface where the first semiconductor chip 100, the second semiconductor chip stack 200, and the third semiconductor chip 300 are arranged, and a lower surface where an external coupling electrode 500 for coupling a semiconductor package to an external element is positioned, the lower surface being positioned opposite to the upper surface. An upper substrate pad SP1 for connection to the first semiconductor chip 100 may be positioned over the upper surface of the substrate S. Also, a lower substrate pad SP2 for connection to the external coupling electrode 500 may be positioned on the lower surface of the substrate S. The upper substrate pad SP1 may be electrically connected to the corresponding lower substrate pad SP2 through a circuit and/or a wiring structure inside the substrate S.

The first semiconductor chip 100 may be positioned over the upper surface of the substrate S. The first semiconductor chip 100 may be positioned between the second semiconductor chip stack 200 and the substrate S and couple the second semiconductor chip stack 200 and the substrate S to each other, and the first semiconductor chip 100 may function as a master chip that controls a plurality of second semiconductor chips 200-1, 200-2 and 200-3 that are included in the second semiconductor chip stack 200. When the second semiconductor chips 200-1, 200-2 and 200-3 are memory chips, the first semiconductor chip 100 may correspond to a logic chip for controlling these memory chips. For example, the first semiconductor chip 100 may substantially correspond to the logic device 1300 of FIG. 1, which is described above.

The first semiconductor chip 100 may include a first body portion 110, a first wiring portion 120, a first through electrode 130, a first front coupling electrode 140, a first bonding layer 150, and a first rear coupling electrode 160.

The first body portion 110 may be formed of a semiconductor material such as silicon (Si) or germanium (Ge), and may have a front surface 111, a rear surface 112, and side surfaces coupling the front surface 111 and the rear surface 112 to each other. The front surface 111 of the first body portion 110 may mean an active surface where the first wiring portion 120 electrically connected to the first through electrode 130 is positioned, and the rear surface 112 of the first body portion 110 may mean a side surface positioned opposite to the front surface 111. The first body portion 110 may be positioned such that the front surface 111 faces the upper surface of the substrate S. In other words, the first body portion 110 may be positioned such that the front surface 111 is positioned downward in the vertical direction and the rear surface 112 is positioned upward in the vertical direction.

The first wiring portion 120 may be positioned over the front surface 111 of the first body portion 110 and may include a variety of circuits/wiring structures. For the sake of convenience in description, the circuits/wiring structures in the first wiring portion 120 is briefly illustrated by lines, but the shape and coupling relationship of the circuits/wiring structures may be modified diversely. Here, the circuits/wiring structures may be realized in diverse ways according to the function of the first semiconductor chip 110. For example, when the first semiconductor chip 110 corresponds to a logic chip, the first wiring portion 120 may include diverse logic circuits for driving and controlling the memory cell array of the memory chip.

The first through electrode 130 may be formed in the first body portion 110. The first through electrode 130 may have a pillar shape extending vertically between the front surface 111 and the rear surface 112 of the first body portion 110 to penetrate the first body portion 110. For example, the first through electrode 130 may be a through silicon via (TSV). The first through electrode 130 may include diverse conductive materials. As an example, the first through electrode 130 may include a metal such as copper (Cu), tin (Sn), silver (Ag), tungsten (W), nickel (Ni), ruthenium (Ru), and cobalt (Co), or a compound of the metal. Although not illustrated, an insulating liner for insulation between the first through electrode 130 and the first body portion 110 may be interposed between the first through electrode 130 and the first body portion 110. Also, although not illustrated, in an embodiment, a barrier metal layer for preventing or mitigating diffusion of the metal forming the first through electrode 130 may be formed to surround the sidewall of the first through electrode 130. A lower end of the first through electrode 130 may be coupled to the first wiring portion 120, and an upper end of the first through electrode 130 may be coupled to the first rear coupling electrode 160.

The first front coupling electrode 140 may be formed over the first wiring portion 120 which is formed over the front surface 111 of the first body portion 110. The first front coupling electrode 140 may be electrically connected to the first wiring portion 120, and as a result, it may be electrically connected to the lower end of the first through electrode 130 through the first wiring portion 120. The first front coupling electrode 140 may have a pillar shape, a plate shape or the like. Also, the first front coupling electrode 140 may include a metal such as copper (Cu), nickel (Ni), or a combination thereof, or a compound of the metal, and the first front coupling electrode 140 may have a single-layer structure or a multi-layer structure.

The first front coupling electrodes 140 may be positioned to respectively overlap with the upper substrate pads SP1 so that the first front coupling electrodes 140 are coupled to a plurality of the upper substrate pads SP1 through the first bonding layer 150, respectively. In other words, the first front coupling electrode 140 and the upper substrate pad SP1 corresponding to each other may be aligned with each other in the vertical direction. To this end, a pitch of the first front coupling electrode 140 may be substantially the same as a pitch of the upper substrate pad SP1. Herein, the pitch may mean a distance between the center of one constituent element and the center of a neighboring constituent element. Also, the embodiment of the present disclosure illustrates a case where the planar area of the first front coupling electrode 140 is substantially the same as the planar area of the upper substrate pad SP1, but the present disclosure is not limited thereto. According to another embodiment of the present disclosure, the planar area of the first front coupling electrode 140 may be different from the planar area of the upper substrate pad SP1.

Also, the first front coupling electrodes 140 may be positioned not to overlap with the first through electrodes 130. Although the first front coupling electrode 140 and the first through electrode 130 do not overlap with each other, the first through electrode 130 and the first front coupling electrode 140 may be electrically connected to each other through the first wiring portion 120. The first through electrode 130 may be arranged to have a small pitch while having a relatively small planar area. Accordingly, the planar area and pitch of the first through electrode 130 may be smaller than the planar area and pitch of the first front coupling electrode 140.

The first bonding layer 150 may be formed over the first front coupling electrode 140. The first bonding layer 150 may bond the first front coupling electrode 140 and the upper substrate pad SP1 to each other. The first bonding layer 150 may include a solder material having a hemispherical shape, a ball shape, or a similar shape. However, the present embodiment of the present disclosure is not limited thereto, and the shape and material of the first bonding layer 150 may be modified diversely. Hereinafter, the upper substrate pad SP1, the first front coupling electrode 140, and the first bonding layer 150 between the upper substrate pad SP1 and the first front coupling electrode 140 may be referred to as a first bonding structure BS1.

The first rear coupling electrode 160 may be formed over the rear surface 112 of the first body portion 110. A plurality of the first rear coupling electrodes 160 may be positioned to overlap with and be coupled to the first through electrodes 130, respectively. In other words, the first rear coupling electrodes 160 and the first through electrodes 130 corresponding to each other may be aligned with each other in the vertical direction. To this end, the pitch of the first rear coupling electrode 160 may be substantially the same as the pitch of the first through electrode 130. Unlike the first front coupling electrode 140, the first rear coupling electrode 160 may directly contact an upper end of the first through electrode 130. The planar area of the first rear coupling electrode 160 may be greater than the planar area of the first through electrode 130. However, since the pitch of the first rear coupling electrode 160 is limited to be relatively small according to the pitch of the first through electrode 130, the planar area of the first rear coupling electrode 160 may also be limited to be relatively small. For example, the planar area of the first rear coupling electrode 160 may be smaller than the planar area of the first front coupling electrode 130. The first rear coupling electrode 160 may have a pillar shape, a plate shape or the like. Also, the first rear coupling electrode 160 may include a metal such as copper (Cu), nickel (Ni), or a combination thereof, or a compound of the metal, and it may have a single-layer structure or a multi-layer structure.

The second semiconductor chip stack 200 may be positioned over the first semiconductor chip 100. The second semiconductor chip stack 200 may include the second semiconductor chips 200-1, 200-2 and 200-3 that are stacked in the vertical direction. The embodiment of the present disclosure illustrates a case where the three second semiconductor chips 200-1, 200-2, and 200-3 are stacked, but the present disclosure is not limited thereto and the number of the second semiconductor chips may be modified diversely. The second semiconductor chips 200-1, 200-2 and 200-3 may be slave chips that are controlled by the first semiconductor chip 100. Each of the second semiconductor chips 200-1, 200-2 and 200-3 may be a memory chip. For example, each of the second semiconductor chips 200-1, 200-2 and 200-3 may substantially correspond to the memory device 1400 of FIG. 1, which is above-described.

Among the second semiconductor chips 200-1, 200-2 and 200-3, each of the second semiconductor chips 200-1 and 200-2 except for the uppermost second semiconductor chip 200-3 may include a second body portion 210, a second wiring portion 220, a second through electrode 230, a second front coupling electrode 240, a second bonding layer 250, and a second rear coupling electrode 260. The uppermost second semiconductor chip 200-3 may have a structure in which the second through electrode 230 and the second rear coupling electrode 260 are omitted from each of the remaining second semiconductor chips 200-1 and 200-2 and an additional second rear coupling electrode 260' is formed instead of the second rear coupling electrode 260.

The second body portion 210 may be formed of a semiconductor material, such as silicon (Si) or germanium (Ge), and may have a front surface 211, a rear surface 212, and side surfaces coupling the front surface 211 and the rear surface 212. The front surface 211 of the second body portion 210 may mean an active surface where the second wiring portion 220 electrically connected to the second through electrode 230 is positioned, and the rear surface 212 of the second body portion 210 may mean a side surface positioned opposite to the front surface 211. The second body portion 210 may be positioned such that the front surface 211 faces the upper surface of the substrate S. In other words, the second body portion 210 may be positioned such that the front surface 211 is positioned downward in the vertical direction and the rear surface 212 is positioned upward in the vertical direction. According to the embodiment of the present disclosure, the second body portion 210 may be arranged to have substantially the same planar area as the first body portion 110 and the side surfaces of the second body portion 210 are aligned with the side surfaces of the first body portion 110. However, the present disclosure is not limited thereto, and according to another embodiment of the present disclosure, the planar area of the second body portion 210 is different from the planar area of the first body portion 110, or at least a portion of the side surfaces of the second body portion 210 and at least a portion of the side surfaces of the first body portion 110 might not be aligned with each other. Even in this case, the corresponding first through electrode 130, first rear coupling electrode 160, second bonding layer 250, second front coupling electrode 240, second through electrode 230, and second rear coupling electrode 260 may be arranged to be aligned with each other in the vertical direction, which will be described later.

The second wiring portion 220 may be positioned over the front surface 211 of the second body portion 210, and may include diverse circuits/wiring structures. For the sake of convenience in explanation, the circuits/wiring structures in the second wiring portion 220 are briefly illustrated by lines, but the shapes and connection relationship of the circuits/wiring structures may be modified diversely. Herein, the circuits/wiring structures may be realized diversely according to the functions of the second semiconductor chips 200-1, 200-2 and 200-3. For example, when the second semiconductor chips 200-1, 200-2 and 200-3 are memory chips, the second wiring portion 220 may include diverse memory cell arrays.

The second through electrode 230 may be formed in the second body portion 210. The second through electrode 230 may have a pillar shape extending in the vertical direction between the front surface 211 and the rear surface 212 of the second body portion 210 to penetrate the second body portion 210. For example, the second through electrode 230 may be a through silicon via (TSV). The second through electrode 230 may include diverse conductive materials. For example, the second through electrode 230 may include a metal, such as copper (Cu), tin (Sn), silver (Ag), tungsten (W), nickel (Ni), ruthenium (Ru), and cobalt (Co), or a compound of the metal. A lower end of the second through electrode 230 may be coupled to the second wiring portion 220, and an upper end of the second through electrode 230 may be coupled to the second rear coupling electrode 260.

Here, a plurality of the second through electrodes 230 may be formed to respectively overlap with a plurality of the first through electrodes 130. In other words, the second through electrodes 230 may be aligned with the corresponding first through electrodes 130 in the vertical direction, and a pitch of the second through electrode 230 may be substantially the same as a pitch of the first through electrode 130. Also, the planar area of the second through electrode 230 may be substantially the same as the planar area of the first through electrode 130.

The second front coupling electrode 240 may be formed over the second wiring portion 220 which is formed over the front surface 211 of the second body portion 210. The second front coupling electrode 240 may be electrically connected to the second wiring portion 120, and may be electrically connected to a lower end of the second through electrode 230 through the second wiring portion 220. The second front coupling electrode 240 may have a pillar shape, a plate shape or the like. Also, the second front coupling electrode 240 may include a metal, such as copper (Cu), nickel (Ni) or a combination thereof, or a compound of the metal, and it may have a single-layer structure or a multi-layer structure.

A plurality of the second front coupling electrodes 240 may be positioned to overlap with a plurality of the second through electrodes 230, respectively. In other words, the second front coupling electrodes 240 may be aligned with the corresponding second through electrodes 230 in the vertical direction, and a pitch of the second front coupling electrode 240 may be substantially the same as a pitch of the second through electrode 230. Also, the planar area of the second front coupling electrode 240 may be substantially the same as the planar area of the first rear coupling electrode 160 while being greater than the planar area of the second through electrode 230.

The second rear coupling electrode 260 may be formed over the rear surface 212 of the second body portion 210. A plurality of the second rear coupling electrodes 260 may be positioned to overlap with and connect to a plurality of the second through electrodes 230, respectively. In other words, the second rear coupling electrodes 260 may be aligned with the corresponding second through electrodes 230 in the vertical direction, and a pitch of the second rear coupling electrode 260 may be substantially the same as the pitch of the second through electrode 230. Unlike the second front coupling electrode 240, the second rear coupling electrode 260 may directly contact the upper end of the second through electrode 230. Also, the planar area of the second rear coupling electrode 260 may be substantially the same as the planar area of the first rear coupling electrode 160 and the second front coupling electrode 240 while being greater than the planar area of the second through electrode 230. The second rear coupling electrode 260 may have a pillar shape, a plate shape, or the like. Also, the second rear coupling electrode 260 may include a metal, such as copper (Cu), nickel (Ni), or a combination thereof, or a compound of the metal, and it may have a single-layer structure or a multi-layer structure.

The second bonding layer 250 may be formed over the second front coupling electrode 240. The second front coupling electrode 240 of the lowermost second semiconductor chip 200-1 may be coupled to the first rear coupling electrode 160 of the first semiconductor chip 100 through the second bonding layer 250. The second front coupling electrodes 240 of the second semiconductor chip 200-2 in the middle and the uppermost second semiconductor chip 200-3 may be respectively coupled to the second rear coupling electrodes 260 of the second semiconductor chip 200-2 in the middle and the lowermost second semiconductor chip 200-1 through the second bonding layer 250. The second bonding layer 250 may include a solder material having a hemispherical shape, a ball shape, or a similar shape. However, the present embodiment is not limited thereto, and the shape and material of the second bonding layer 250 may be modified diversely. The second front coupling electrode 240 of the lowermost second semiconductor chip 200-1, the first rear coupling electrode 160 of the first semiconductor chip 100, and the second bonding layer 250 therebetween may be, hereinafter referred to as a second bonding structure BS2. Also, the second front coupling electrodes 240 of the middle and uppermost second semiconductor chips 200-2 and 200-3, the second rear coupling electrodes 260 of the lowermost and middle second semiconductor chips 200-1 and 200-2, and the second bonding layers 250 therebetween may be hereinafter referred to as a second bonding structure BS2.

Here, since the upper substrate pad SP1 and the first front coupling electrode 140 have a relatively large planar area, the volume of the first bonding layer 150 bonding the upper substrate pad SP1 and the first front coupling electrode 140 may be relatively large as well. On the other hand, since the first rear coupling electrode 160, the second front coupling electrode 240, and the second rear coupling electrode 260 have a relatively small planar area, the volume of the second bonding layer 250 bonding between the first rear coupling electrode 160 and the second front coupling electrodes 240 or between the second rear coupling electrode 260 and the second front coupling electrode 240 may be relatively small. As a result, in the vertical direction, a height D1 of the first bonding structure BS1 may be greater than a height D2 of the second bonding structure BS2. In other words, the gap between the first wiring layer 120 of the first semiconductor chip 100 and the upper surface of the substrate S may be greater than the gap between the rear surface 112 of the first semiconductor chip 100 and the second wiring layer 220 of the lowermost second semiconductor chip 200-1, the gap between the rear surface 112 of the lowermost second semiconductor chip 200-1 and the second wiring layer 220 of the second semiconductor chip 200-2 in the middle, and the gap between the rear surface 112 of the second semiconductor chip 200-2 in the middle and the second wiring layer 220 of the uppermost second semiconductor chip 200-3.

In the stacked structure of the first semiconductor chip 100 and the second semiconductor chip stack 200 described above, the lowermost second semiconductor chip 200-1 may exchange signals with an external constituent element through an electronic connection path passing through an external coupling electrode 500, the circuits/wiring structures and the upper substrate pad SP1 of the substrate S, the first bonding layer 150, the first front coupling electrode 140, the first wiring layer 120, the first through electrode 130, and the first rear coupling electrode 160 of the first semiconductor chip 100, and the second bonding layer 250, the second front coupling electrode 240, and the second wiring layer 220 of the lowermost second semiconductor chip 200-1, or receive power supplied from an external constituent element. Similarly, the second semiconductor chip 200-2 in the middle may exchange signals with an external constituent element through an electronic connection path passing through the external coupling electrode 500, the circuits/wiring structures and the upper substrate pad SP1 of the substrate S, the first bonding layer 150, the first front coupling electrode 140, the first wiring layer 120, the first through electrode 130, and the first rear coupling electrode 160 of the first semiconductor chip 100, and the second bonding layer 250, the second front coupling electrode 240, and the second wiring layer 220, the second through electrode 230, and the second rear coupling electrode 260 of the lowermost second semiconductor chip 200-1, and the second bonding layer 250, the second front coupling electrode 240, and the second wiring layer 220 of the second semiconductor chip 200-2 in the middle, or receive power supplied from an external constituent element. Similarly, the uppermost second semiconductor chip 200-3 may exchange signals with an external constituent element through an electronic connection path passing through the external coupling electrode 500, the circuits/wiring structures and the upper substrate pad SP1 of the substrate S, the first bonding layer 150, the first front coupling electrode 140, the first wiring layer 120, the first through electrode 130, and the first rear coupling electrode 160 of the first semiconductor chip 100, and the second bonding layer 250, the second front coupling electrode 240, and the second wiring layer 220, the second through electrode 230, and the second rear coupling electrode 260 of the lowermost second semiconductor chip 200-1, the second bonding layer 250, the second front coupling electrode 240, the second wiring layer 220, the second through electrode 230, and the second rear coupling electrode 260 of the second semiconductor chip 200-2 in the middle, and the second bonding layer 250, the second front coupling electrode 240, and the second wiring layer 220 of the uppermost second semiconductor chip 200-3 or receive power supplied from an external constituent element.

The uppermost second semiconductor chip 200-3 might not include the second through electrode 230 because it does not have to transfer signals or provide power upward anymore. However, the uppermost second semiconductor chip 200-3 may include an additional second rear coupling electrode 260' positioned on its rear surface 212 for physical connection with a third semiconductor chip 300, which will be described later.

Meanwhile, in order to reduce the thickness of a semiconductor package, the thickness of each of the first semiconductor chip 100 and the second semiconductor chip 200-1, 200-2 and 200-3 that are stacked in the vertical direction may be relatively thin. However, when external stress is applied to the semiconductor package, for example, during quality inspection in which pressure is arbitrarily applied to ensure the force that the semiconductor package endures, the relatively thin first semiconductor chip 100 and the second semiconductor chip 200-1, 200-2 and 200-3 may have a crack defect. Such a crack defect may be further aggravated when the first semiconductor chip 100 and the second semiconductor chip 200-1, 200-2 and 200-3 include the first and second through electrodes 130 and 230. According to the embodiment of the present disclosure, a third semiconductor chip 300 for stress relief may be further positioned over the second semiconductor chip stack 200 in order to prevent or mitigate such defects.

The third semiconductor chip 300 may be a dummy semiconductor chip that does not perform any electrical function. The third semiconductor chip 300 might not be electrically connected to the first semiconductor chip 100 and the second semiconductor chip stack 200. However, the third semiconductor chip 300 may be physically connected to the uppermost second semiconductor chip 200-3 of the second semiconductor chip stack 200, which will be described later. In an embodiment the third semiconductor chip 300 may be a dummy third semiconductor chip that does not perform any electrical function.

According to the embodiment of the present disclosure, the third semiconductor chip 300 may have a structure in which the first rear coupling electrode 160 is excluded from the structure of the first semiconductor chip 100. However, the concept and spirit of the present disclosure are not limited thereto, and the third semiconductor chip 300 may have the same structure as that of the first semiconductor chip 100 by further including the first rear coupling electrode 160. To be more specific, the third semiconductor chip 300 may include a third body portion 310, a third wiring portion 320, a third through electrode 330, a third front coupling electrode 340, and a third bonding layer 350. The third body portion 310, the third wiring portion 320, the third through electrode 330, the third front coupling electrode 340, and the third bonding layer 350 may be substantially the same as the first body portion 110, the first wiring portion 120, the first through electrode 130, the first front coupling electrode 140, and the first bonding layer 150 of the above-described first semiconductor chip 100. Accordingly, the third front coupling electrode 340 and the third bonding layer 350 may have a pitch and a planar area that are greater than those of the first to third through electrodes 330, and furthermore, they may have a greater pitch and a greater planar area than the first rear coupling electrode 160, the second front coupling electrode 240, and the second rear coupling electrode 260.

In order to connection with the third front coupling electrode 340 through the third bonding layer 350, a plurality of additional second rear coupling electrodes 260' may be positioned to overlap with a plurality of the third front coupling electrodes 340. In other words, the third front coupling electrode 340 and the additional second rear coupling electrode 260' corresponding to each other may be aligned with each other in the vertical direction, and the pitch of the third front coupling electrode 340 may be substantially the same as the pitch of the additional second rear coupling electrode 260'. Also, the embodiment of the present disclosure illustrates a case where the planar area of the third front coupling electrode 340 is substantially the same as the planar area of the additional second rear coupling electrode 260', but the concept and disposure of the present disclosure are not limited thereto. According to another embodiment of the present disclosure, the planar area of the third front coupling electrode 340 may be different from the planar area of the additional second rear coupling electrode 260'. For example, the additional second rear coupling electrode 260' may have substantially the same pitch and planar area as the pitch and planar area of the upper substrate pad SP1.

The additional second rear coupling electrode 260', the third front coupling electrode 340, and the third bonding layer 350 therebetween may be hereinafter referred to as a third bonding structure BS3. Herein, since the additional second rear coupling electrode 260' and the third front coupling electrode 340 have a relatively large planar area, the volume of the third bonding layer 150 bonding the additional second rear coupling electrode 260' and the third front coupling electrode 340 may also be relatively large. Accordingly, in the vertical direction, a height D3 of the third bonding structure BS3 may be greater than the height D2 of the second bonding structure BS2. In other words, the gap between the third wiring layer 320 of the third semiconductor chip 300 and the rear surface 212 of the uppermost second semiconductor chip 200-3 may be greater than the gap between the rear surface 112 of the first semiconductor chip 100 and the second wiring layer 220 of the lowermost second semiconductor chip 200-1, the gap between the rear surface 112 of the lowermost second semiconductor chip 200-1 and the second wiring layer 220 of the middle second semiconductor chip 200-2, and the gap between the rear surface of the middle second semiconductor chip 200-2 and the second wiring layer 220 of the uppermost second semiconductor chip 200-2. Furthermore, the height D3 of the third bonding structure BS3 may be substantially the same as the height D1 of the first bonding structure BS1.

As described above, when the third semiconductor chip 300 has the same structure as that of the first semiconductor chip 100 or when the third semiconductor chip 300 has a structure in which the first rear coupling electrode 160 is omitted from the first semiconductor chip 100, there are, in an embodiment, the following advantages.

First, in an embodiment, since the height D3 of the third bonding structure BS3 is greater than the height D2 of the second bonding structure BS2, when the molding layer 400, which will be described later, is formed, the area occupied by a molding material between the third bonding structures BS3 may increase, thus improving the above-described stress relieving effect. Also, in this case, in an embodiment, it is possible to fill the molding material while minimizing the occurrence of voids between the third bonding structures BS3, various defects that may occur due to the presence of voids may be prevented or mitigated.

Also, in an embodiment, since the third semiconductor chip 300 having the same structure as the first semiconductor chip 100 is used, the fabrication process of the semiconductor package may require less steps than having a third semiconductor chip 300 not having the same structure as the first semiconductor chip 100, and the cost may be reduced. Particularly, in an embodiment, when the first semiconductor chip 100 that is no longer functionally usable due to a defect is used as the third semiconductor chip 300, the fabrication cost may be reduced furthermore.

However, the concept and spirit of the present disclosure are not limited thereto, and the third semiconductor chip 300 may have a structure different from the structure of the first semiconductor chip 100. Even in this case, too, it may be assumed that the pitch of the third bonding structure BS3 may be greater than the pitch of the second bonding structure BS2 and the height D3 of the third bonding structure BS3 is greater than the height D2 of the second bonding structure BS2 because the planar area and pitch of the third front coupling electrode 340 of the third semiconductor chip 300 and the additional second rear coupling electrode 260' of the uppermost second semiconductor chip 200-3 are greater than the planar areas and pitches of the first rear coupling electrode 160, the second front coupling electrode 240, and the second rear coupling electrode 260.

The molding layer 400 may be formed to mold the first semiconductor chip 100, the second semiconductor chip stack 200, and the third semiconductor chip 300 over the upper surface of the substrate S. In other words, the molding layer 400 may fill the space between the first bonding structures BS1, the second bonding structures BS2, and the space between the third bonding structures BS3, while covering the first semiconductor chip 100, the second semiconductor chip stack 200, and the third semiconductor chip 300. The molding layer 400 may include a molding material, such as epoxy molding compound (EMC).

The external coupling electrode 500 may serve to electrically connect the semiconductor package of the present embodiment to an external constituent element. Although this embodiment illustrates the external coupling electrode 500 having a ball shape, the concept and the spirit of the present disclosure are not limited thereto, and the external coupling electrode 500 may have diverse shapes such as a pillar shape, a ball shape, or a combination thereof. Also, the external coupling electrode 500 may include diverse materials, such as a solder material, a metal material, or a combination thereof.

Accordingly, as the second semiconductor chip stack 200 functioning as a memory device and the first semiconductor chip 100 functioning as a logic device are integrated into one package, SIP further including the third semiconductor chip 300 functioning as a buffer for external stress may be realized.

Figure 3:
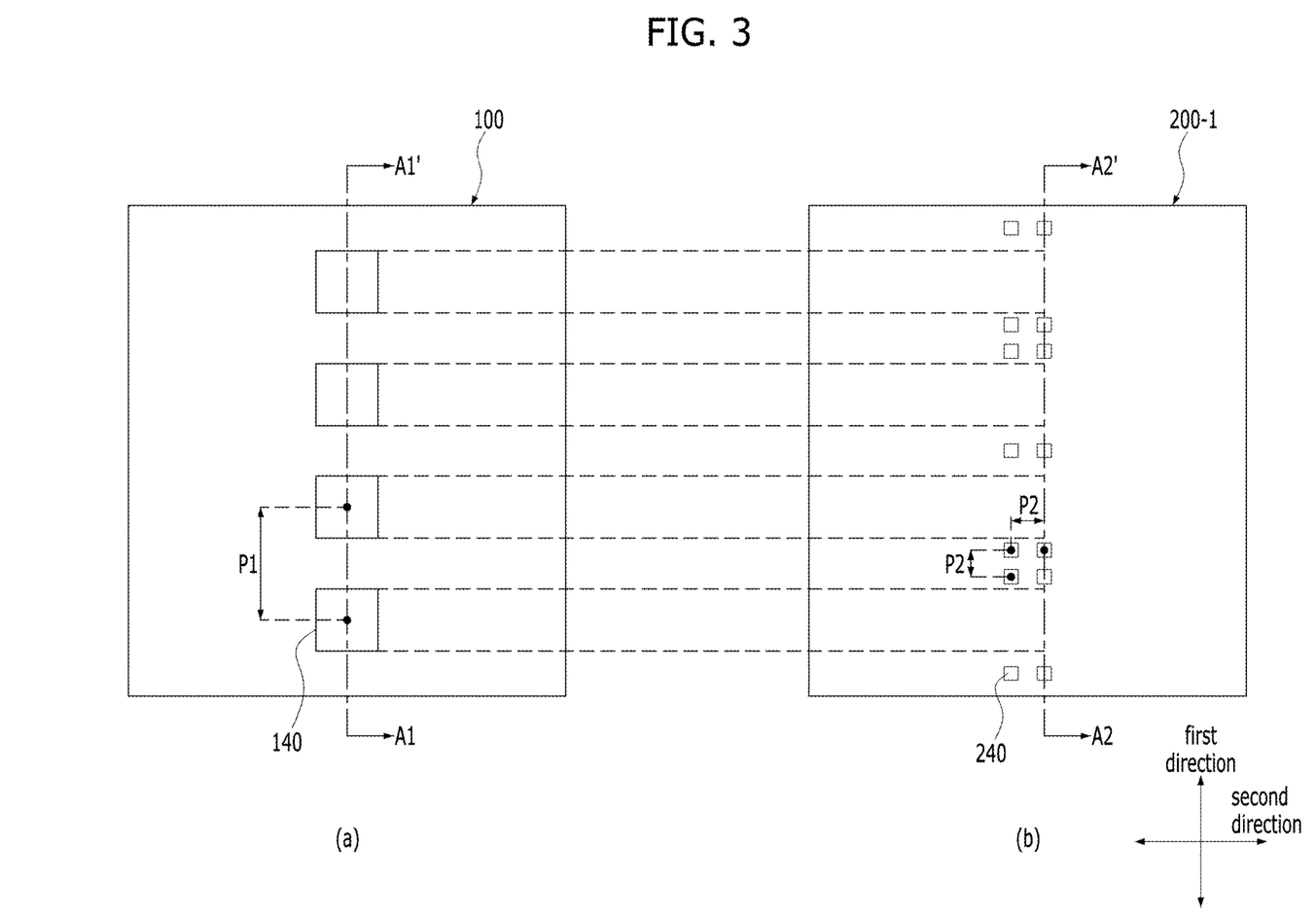
FIG. 3 is a plan view illustrating a first front coupling electrode of a first semiconductor chip and a second front coupling electrode of a second semiconductor chip shown in FIG. 2.

FIG. 3 is a plan view illustrating the first front coupling electrode 140 of a first semiconductor chip 100 and a second front coupling electrode 240 of a second semiconductor chip 200 shown in FIG. 2. A cross-section taken along the line A1-A1' shown in (a) of FIG. 3 may correspond to the first semiconductor chip 100 of FIG. 2, and a cross-section taken along the line A2-A2' shown in (b) of FIG. 3 may correspond to the second semiconductor chip 200-1 of FIG. 2.

Referring to (a) of FIG. 3, the first front coupling electrodes 140 of the first semiconductor chip 100 may be arranged in a horizontal direction, particularly, in a first direction. Although the embodiment of the present disclosure illustrates a case where the first front coupling electrodes 140 are arranged in a line in the first direction is illustrated, the concept and spirit of the present disclosure are not limited thereto. According to another embodiment of the present disclosure, the first front coupling electrodes 140 may be arranged in two or more rows in the first direction.

Also, although the first front coupling electrode 140 is illustrated as having a square shape from the perspective of a plan view, the present disclosure is not limited thereto. According to another embodiment of the present disclosure, the first front coupling electrode 140 may have diverse planar shapes, such as a rectangle shape, a circle shape, or an oval shape.

Also, the first front coupling electrode 140 may be arranged to have a first pitch P1 in the first direction.

Although not illustrated, the upper substrate pad SP1, the additional second rear coupling electrode 260', and the third front coupling electrode 340 shown in FIG. 2 may also be arranged to have the first pitch P1 while overlapping with the first front coupling electrode 140. The third front coupling electrode 340 may have substantially the same planar area and planar shape as those of the first front coupling electrode 140. The upper substrate pad SP1 or the additional second rear coupling electrode 260' may have a planar area and a planar shape which are the same as or different from those of the first front coupling electrode 140.

Referring to (b) of FIG. 3, the second front coupling electrodes 240 of the second semiconductor chip 200 may be arranged in the horizontal direction, in particular, in the first direction. Furthermore, the second front coupling electrode 240 may be positioned not to overlap with the first front coupling electrode 140. For example, the second front coupling electrode 240 may be positioned in an area between the first front coupling electrodes 140 that are adjacent in the first direction. The embodiment of the present disclosure illustrates a case where one or two second front coupling electrodes 240 in the first direction are positioned in the area between the first front coupling electrodes 140 that are adjacent to each other in the first direction and, in the second direction, two second front coupling electrodes 240 are positioned. However, the concept and spirit of the present disclosure are not limited thereto. According to another embodiment of the present disclosure, the number of the second front coupling electrodes 240 arranged in the first direction and the second direction may be diversely modified. Furthermore, although the embodiment of the present disclosure illustrates a case where one first front coupling electrode 240 in the first direction are alternately arranged with one or two second front coupling electrodes 240, the concept and spirit of the present disclosure are not limited thereto. According to another embodiment of the present disclosure, one or more first front coupling electrodes 240 may be alternately arranged with one or more second front coupling electrodes 240 in the first direction.

Also, although the second front coupling electrode 240 is illustrated as having a square shape from the perspective of a plan view, the concept and spirit of the present disclosure are not limited thereto. According to another embodiment of the present disclosure, the second front coupling electrode 240 may have a diverse planar shape such as a rectangle shape, a circle shape, or an oval shape.

Also, the second front coupling electrodes 240 may be arranged to have a second pitch P2 in the first direction and the second direction. The second pitch P2 may be smaller than the first pitch P1. The planar area of the second front coupling electrode 240 may be smaller than the planar area of the first front coupling electrode 140.

Although not illustrated, the first rear coupling electrode 160 and the second rear coupling electrode 260 of FIG. 2 may also be arranged to overlap with the second front coupling electrode 240 and have the second pitch P2. The first rear coupling electrode 160 and the second rear coupling electrode 260 may have substantially the same planar area and planar shape as those of the second front coupling electrode 240.

Figure 4A:
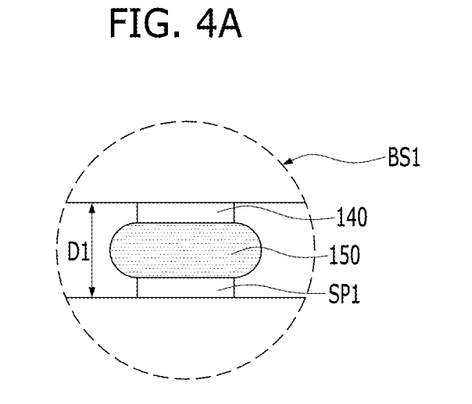
FIG. 4A is an enlarged cross-sectional view illustrating a first bonding structure shown in FIG. 2.
Figure 4B:
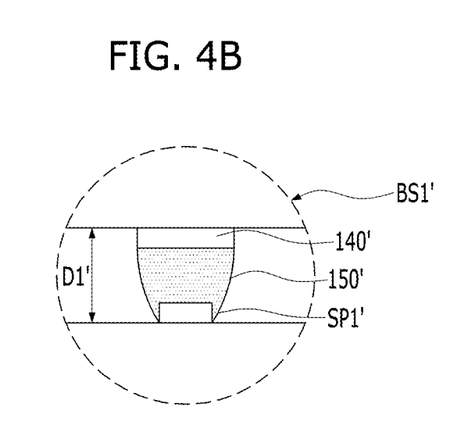
FIG. 4B is an enlarged cross-sectional view illustrating another example of the first bonding structure.
Figure 4C:
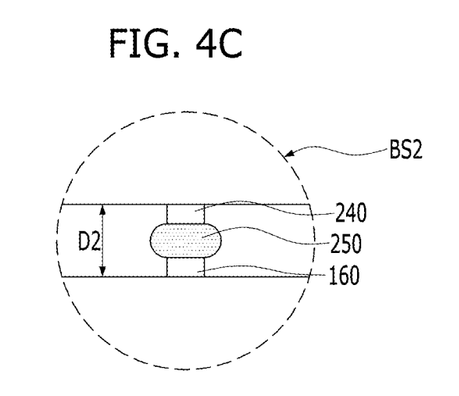
FIG. 4C is an enlarged cross-sectional view illustrating a second bonding structure BS2 shown in FIG. 2.

FIG. 4A is an enlarged cross-sectional view illustrating a first bonding structure shown in FIG. 2. FIG. 4B is an enlarged cross-sectional view illustrating another example of the first bonding structure. FIG. 4C is an enlarged cross-sectional view illustrating a second bonding structure BS2 shown in FIG. 2.

Referring to FIG. 4A, the first bonding structure BS1 may include the upper substrate pad SP1, the first front coupling electrode 140, and the first bonding layer 150 therebetween, and the first bonding structure BS1 may have the first height D1.

The first bonding layer 150 may have a lower surface contacting the upper substrate pad SP1, an upper surface contacting the first front coupling electrode 140, and a side surface coupling the lower surface and the upper surface. Herein, since the upper substrate pad SP1 and the first front coupling electrode 140 have substantially the same planar area, the first bonding layer 150 may have a side surface that convexly protrudes from the side surface of the upper substrate pad SP1 and the side surface of the first front coupling electrode 140.

Although not illustrated, the third bonding structure BS3 may also have substantially the same structure and shape as those of the first bonding structure BS1.

On the other hand, referring to FIG. 4B, a first bonding structure BS1' may include an upper substrate pad SP1', a first front coupling electrode 140', and a first bonding layer 150' positioned therebetween, and the first bonding structure BS1' may have a first height D1'.

Herein, the planar area of the upper substrate pad SP1' may be smaller than the planar area of the first front coupling electrode 140'. In this case, the first bonding layer 150' may be formed to have a shape having an upper surface that is in contact with the first front coupling electrode 140' and width decreases as it goes down, and to cover the side surface of the upper substrate pad SP1' while contacting the upper surface of the upper substrate pad SP1'. Accordingly, the side surface of the first bonding layer 150' might not protrude outside the side surface of the first front coupling electrode 140'.

Although not illustrated, the third bonding structure may also have substantially the same structure and shape as the first bonding structure BS1'.

Referring to FIG. 4C, the second bonding structure BS2 may include the first rear coupling electrode 160, the second front coupling electrode 240, and the second bonding layer 250 positioned therebetween, and may have the second height D2 which is smaller than the first height D1. The second bonding structure BS2 may include the second rear coupling electrode 260 instead of the first rear coupling electrode 160.

The second bonding layer 250 may have a lower surface in contact with the first rear coupling electrode 160, an upper surface in contact with the second front coupling electrode 240, and a side surface coupling the lower surface and the upper surface. Herein, since the first rear coupling electrode 160 and the second front coupling electrode 240 have substantially the same planar area, the second bonding layer 250 may have a side surface that convexly protrudes from the first rear coupling electrode 160 and the second front coupling electrode 240.

Figure 5:
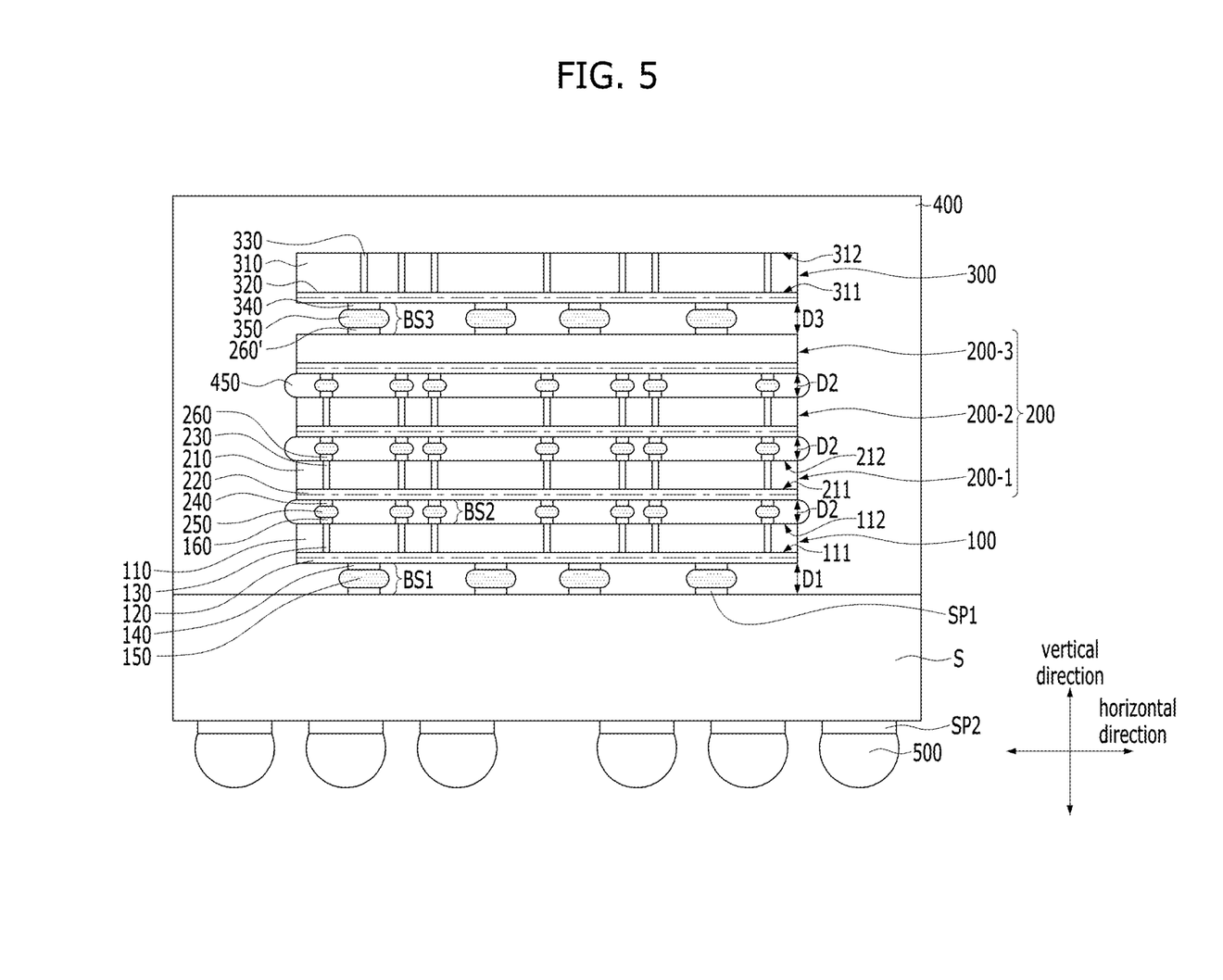
FIG. 5 is a cross-sectional view illustrating a semiconductor package in accordance with another embodiment of the present disclosure.

FIG. 5 is a cross-sectional view illustrating a semiconductor package in accordance with another embodiment of the present disclosure. Differences from the embodiment of FIG. 2 will be mainly described.

Referring to FIG. 5, a space between the second bonding structures BS2 may be filled with a filling material 450, such as an underfill rather than the molding layer 400. Since the filling material 450 has excellent fluidity than the molding layer 400, the space between the second bonding structures BS2 may be filled easier than using the molding layer 400.

On the other hand, the space between the first bonding structures BS1 and the space between the third bonding structures BS3 may be filled with the molding layer 400. Since the height D1 of the first bonding structure BS1 and the height D3 of the third bonding structure D3 are greater than the height D2 of the second bonding structure BS2, even if a separate filling material is not used, the space between the first bonding structures BS1 and the space between the third bonding structures BS3 may be filled.

According to the embodiment of the present disclosure, a semiconductor package which includes a plurality of semiconductor chips stacked in a vertical direction and is capable of improving a fabrication process while relieving stress applied thereto.

Figure 6:
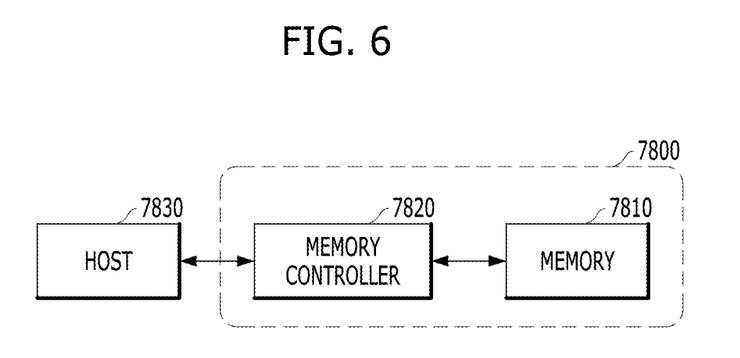
FIG. 6 shows a block diagram illustrating an electronic system including a memory card 7800 employing at least one of the semiconductor packages according to the embodiments.

FIG. 6 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 7:
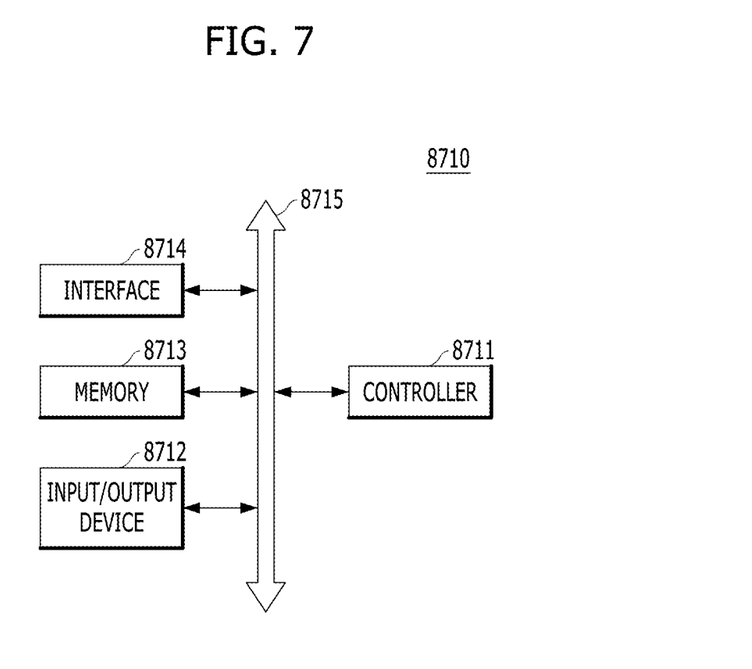
FIG. 7 shows a block diagram illustrating an electronic system 8710 including at least one of the semiconductor packages according to described embodiments.

FIG. 7 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data moves.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

While the present disclosure has been described with respect to the specific embodiments, it will be apparent to those skilled in the art that various changes and modifications may be made without departing from the spirit and scope of the disclosure as defined in the following claims.

What is claimed is:

1. A semiconductor package, comprising:
a substrate;
a first semiconductor chip positioned over the substrate and electrically connected to the substrate;
a plurality of second semiconductor chips positioned over the first semiconductor chip in a vertical direction, wherein the plurality of second semiconductor chips include a lowermost second semiconductor chip and an uppermost second semiconductor chip;
a third semiconductor chip positioned over the upper most second semiconductor chip stack;
a plurality of first bonding structures with a first pitch between the substrate and the first semiconductor chip, wherein each of the plurality of first bonding structures has a first height;
a plurality of second boding structures with a second pitch between the second semiconductor chips, wherein each of the plurality of second bonding structures has a second height; and
a plurality of third bonding structures with a third pitch between the uppermost second semiconductor chip and the third semiconductor chip, wherein each of the plurality of third bonding structures has a third height,
wherein the third height is greater than the second height.

2. The semiconductor package of claim 1, wherein the first height is greater than the second height.

3. The semiconductor package of claim 2, wherein the third height is substantially the same as the first height.

4. The semiconductor package of claim 2, wherein the third pitch and the first pitch are greater than the second pitch.

5. The semiconductor package of claim 4, wherein the third pitch and the first pitch are substantially a same as each other.

6. The semiconductor package of claim 1, wherein the third pitch is greater than the second pitch.

7. The semiconductor package of claim 6,
wherein one of the first bonding structures includes:
an upper substrate pad over an upper surface of the substrate;
a first front coupling electrode over a front surface of the first semiconductor chip; and
a first bonding layer between the upper substrate pad and the first front coupling electrode,
wherein one of the plurality of second bonding structures includes:
a first rear coupling electrode over a rear surface of the first semiconductor chip;
a lowermost second front coupling electrode over a front surface of the lowermost second semiconductor chips; and
a lower second bonding layer between the first rear coupling electrode and the lowermost second front coupling electrode
wherein one of the plurality of third bonding structures includes:
an uppermost second rear coupling electrode over an uppermost surface of the uppermost semiconductor chip;
a third front coupling electrode over a front surface of the third semiconductor chip; and
a third bonding layer between the uppermost second rear coupling electrode and the third front coupling electrode,
wherein:
planar areas of the third front coupling electrode and the uppermost second rear coupling electrode are greater than planar areas of the lowermost second front coupling electrode and the first rear coupling electrode.

8. The semiconductor package of claim 7,
wherein planar areas of the first front coupling electrode and the upper substrate pad are greater than the planar areas of the lowermost second front coupling electrode and the first rear coupling electrode.

9. The semiconductor package of claim 1, wherein each of the plurality of third bonding structures is not vertically overlapping with the plurality of second bonding structures.

10. The semiconductor package of claim 1, wherein each of the first bonding structures and the plurality of third bonding structures are vertically overlapped.

11. The semiconductor package of claim 1, wherein:
the first semiconductor chip includes a first through electrode vertically overlapping with the second bonding structure,
the lowermost second semiconductor chip includes a lowermost second through electrode vertically overlapping with the second bonding structure, and
the uppermost second semiconductor chip does not include any through electrodes.

12. The semiconductor package of claim 1, wherein a structure of the third semiconductor chip has substantially a same as a structure of the first semiconductor chip.

13. The semiconductor package of claim 1, wherein the third semiconductor chip has a plurality of through electrodes vertically overlapping the first bonding structures.

14. The semiconductor package of claim 1, wherein spaces between the plurality of second bonding structures and spaces between the plurality of third bonding structures are filled with a molding material.

15. The semiconductor package of claim 1, wherein spaces between the plurality of third bonding structures are filled with a molding material, and spaces between the plurality of second bonding structures are filled with a filling material having a higher fluidity than the molding material.

16. A semiconductor package, comprising:
a substrate;
a first semiconductor chip positioned over the substrate;
a lowermost second semiconductor chip positioned over the first semiconductor chip;
a middle second semiconductor chip positioned over the lowermost semiconductor chip;
an uppermost semiconductor chip positioned over the middle semiconductor chip;
a third semiconductor chip positioned over the uppermost second semiconductor chip;
a plurality of first bonding structures with a first pitch between the substrate and the first semiconductor chip;
a plurality of lower second bonding structures with a second pitch between the first semiconductor chip and the lowermost semiconductor chip;
a plurality of upper second bonding structures with the second pitch between the middle semiconductor chip and the uppermost semiconductor chip; and
a plurality of third bonding structures with a third pitch between the uppermost semiconductor chip and the third semiconductor chip;
wherein the first pitch and the third pitch are greater than the second pitch.

17. The semiconductor package of claim 16, wherein the first pitch is equal to the third pitch.

18. The semiconductor package of claim 16, wherein:
each of the plurality of first bonding structures has a first height;
each of the plurality of lower and upper second bonding structures has a second height; and
each of the plurality of third bonding structures has a third height,
wherein the first height is greater than the second height.

19. The semiconductor package of claim 18, wherein the first height is equal to the third height.

20. A semiconductor package comprising:
a substrate;
a first semiconductor chip over the substrate;
a plurality of second semiconductor chips stacked over the first semiconductor chips;
a third semiconductor chips over the plurality of second semiconductor chips;
a plurality of first bonding structures between the substrate and the first semiconductor chip;
a plurality of second bonding structures between the first semiconductor chip and a lowermost second semiconductor chip of the plurality of second semiconductor chips and between the plurality of second semiconductor chips; and
a plurality of third bonding structures between an uppermost semiconductor chip of the plurality of second semiconductor chips and the third semiconductor chip,
wherein:
the plurality of first bonding structures vertically overlap with the plurality of third bonding structures,
the plurality of second bonding structures vertically overlap with each other,
the plurality of first bonding structures and the plurality of third bonding structures do not vertically overlap with the plurality of second bonding structures.

* * * * *